(12) United States Patent
Inao et al.

(10) Patent No.: US 9,352,542 B2
(45) Date of Patent: May 31, 2016

(54) PROCESSING METHOD AND PROCESSING APPARATUS

(71) Applicant: Tokyo Ohka Kogyo Co., Ltd., Kawasaki-shi (JP)

(72) Inventors: Yoshihiro Inao, Kawasaki (JP); Atsuo Kajima, Kawasaki (JP); Takuma Hasegawa, Kawasaki (JP); Koki Tamura, Kawasaki (JP); Shigeru Yokoi, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/376,772

(22) PCT Filed: Jan. 11, 2013

(86) PCT No.: PCT/JP2013/050468
§ 371 (c)(1),
(2) Date: Aug. 5, 2014

(87) PCT Pub. No.: WO2013/118536
PCT Pub. Date: Aug. 15, 2013

(65) Prior Publication Data
US 2015/0013917 A1  Jan. 15, 2015

(30) Foreign Application Priority Data
Feb. 7, 2012 (JP) .................... 2012-024472

(51) Int. Cl.
*B32B 38/10* (2006.01)
*B32B 43/00* (2006.01)
(Continued)

(52) U.S. Cl.
CPC ........ *B32B 43/006* (2013.01); *H01L 21/02057* (2013.01); *H01L 21/31111* (2013.01);
(Continued)

(58) Field of Classification Search
CPC ................... Y10T 156/1917; Y10T 156/1111; Y10T 156/1158; Y10T 156/1994; Y10T 156/1195; B32B 38/10; B32B 43/006
USPC .......... 156/712, 719, 753, 767, 930, 931, 941
See application file for complete search history.

(56) References Cited

U.S. PATENT DOCUMENTS 5,476,566 A * 12/1995 Cavasin ..................... 156/249
6,127,199 A    10/2000 Inoue et al.
(Continued)

FOREIGN PATENT DOCUMENTS

JP    10-125931    5/1998
JP    2003-80658   3/2003
(Continued)

OTHER PUBLICATIONS

Office Action in corresponding Japanese Patent Application No. 2013-557442, dated Sep. 9, 2014.
(Continued)

*Primary Examiner* — Mark A Osele
*Assistant Examiner* — Nickolas Harm
(74) *Attorney, Agent, or Firm* — Knobbe Martens Olson & Bear LLP

(57) ABSTRACT

A bonding method including an adhesive layer forming process in which a thermoplastic adhesive is applied to a substrate or a support plate and an adhesive layer is formed; a heating process in which the adhesive layer that is formed on the substrate or the support plate is heated; and a bonding process in which the substrate and the support plate are pressed against each other via the heated adhesive layer, thereby bonding the substrate and the support plate.

18 Claims, 4 Drawing Sheets

(51) Int. Cl.
*H01L 21/02* (2006.01)
*H01L 21/311* (2006.01)
*H01L 21/683* (2006.01)

(52) U.S. Cl.
CPC ...... *H01L21/31133* (2013.01); *H01L 21/6835* (2013.01); *H01L 21/6836* (2013.01); *B32B 38/10* (2013.01); *B32B 2307/748* (2013.01); *H01L 2221/6834* (2013.01); *H01L 2221/68318* (2013.01); *H01L 2221/68327* (2013.01); *H01L 2221/68381* (2013.01); *Y10T 156/1111* (2015.01); *Y10T 156/1158* (2015.01); *Y10T 156/1195* (2015.01); *Y10T 156/1917* (2015.01); *Y10T 156/1994* (2015.01)

(56) References Cited

U.S. PATENT DOCUMENTS

| | | | |
|---|---|---|---|
| 6,372,608 | B1 | 4/2002 | Shimoda et al. |
| RE38,466 | E | 3/2004 | Inoue et al. |
| RE40,601 | E | 12/2008 | Inoue et al. |
| 8,715,802 | B2 * | 5/2014 | Tsai et al. .................. 428/41.8 |
| 2002/0146893 | A1 | 10/2002 | Shimoda et al. |
| 2003/0224582 | A1 | 12/2003 | Shimoda et al. |
| 2004/0112880 | A1 | 6/2004 | Sekiya |
| 2004/0188861 | A1 | 9/2004 | Kurimoto et al. |
| 2004/0211762 | A1 | 10/2004 | Sekiya et al. |
| 2004/0219762 | A1 | 11/2004 | Shimoda et al. |
| 2006/0030122 | A1 | 2/2006 | Shimoda et al. |
| 2006/0105544 | A1 | 5/2006 | Takanashi et al. |
| 2007/0010067 | A1 | 1/2007 | Shimoda et al. |
| 2009/0314438 | A1 * | 12/2009 | Iwata et al. .................. 156/584 |
| 2010/0041211 | A1 * | 2/2010 | Noda et al. .................. 438/464 |
| 2010/0304551 | A1 | 12/2010 | Takanashi et al. |
| 2010/0323469 | A1 * | 12/2010 | Borthakur et al. ............. 438/65 |
| 2011/0290415 | A1 * | 12/2011 | George ..................... 156/247 |
| 2011/0316120 | A1 * | 12/2011 | Rogers et al. ................. 257/615 |

FOREIGN PATENT DOCUMENTS

| | | |
|---|---|---|
| JP | 2004-188475 | 7/2004 |
| JP | 2004-296935 | 10/2004 |
| JP | 2004-322168 | 11/2004 |
| JP | 2006-140311 | 6/2006 |
| JP | 2009-095962 | 5/2009 |

OTHER PUBLICATIONS

International Search Report for PCT/JP2013/050468 dated Apr. 16, 2013.

* cited by examiner

| | PROCESSING WITHOUT GUARD | WATER GUARD (100 cc) | WATER GUARD (250 cc) | WATER GUARD (1000 cc) |
|---|---|---|---|---|
| GENERAL VIEW PHOTOGRAPH |  |  |  |  |
| DETERMINATION | 1 | 2 | 4 | 4 |
| MICROSCOPE PHOTOGRAPH |  |  | | |
| DETERMINATION | 1 | 1 | 2 | 2 |

FIG. 4

| | TPF (0.4 μm) | TPF (1.4 μm) | TPF (2.6 μm) | TPF (0.7 μm) + WATER GUARD (250 cc) |
|---|---|---|---|---|
| GENERAL VIEW PHOTOGRAPH | | | | |
| DETERMINATION | 2 | 3 | 5 | 5 |
| MICROSCOPE PHOTOGRAPH | | | | |
| DETERMINATION | 3 | 4 | 5 | 4 |

PROCESSING METHOD AND PROCESSING APPARATUS

This application is the U.S. National Phase under 35 U.S.C. § 371 of International Application No. PCT/JP2013/050468, filed Jan. 11, 2013, designating the U.S., and published in Japanese as WO 2013/118536 on Aug. 15, 2013, which claims priority to Japanese Patent Application No. 2012-024472, filed Feb. 7, 2012, the entire content of which is incorporated herein by reference.

TECHNICAL FIELD

The present invention relates to a processing method and a processing apparatus.

BACKGROUND ART

As an example of a wafer processing technology, PTL 1 and PTL 2 disclose a laser processing technology in which a wafer is irradiated with laser beams to cut the wafer into respective chips. In the laser processing technology, to prevent an effect of debris that occurs during cutting of the wafer with laser, a protective film is formed on a surface of the wafer at the time of the cutting.

CITATION LIST

Patent Literature

[PTL 1] JP-A-2004-188475 (published on Jul. 8, 2004)
[PTL 2] JP-A-2004-322168 (published on Nov. 18, 2004)

SUMMARY OF INVENTION

Technical Problem

Along with an increase in functionality of a cellular phone, a digital AV apparatus, an IC card, and the like, a reduction in size and thickness has progressed in a semiconductor silicon chip (hereinafter, referred to as a chip) that is mounted thereon, and thus a demand for high integration of chips in a package has increased. To realize high integration of the chips in the package, it is necessary to make the thickness of the chips as small as 150 µm or less.

However, a semiconductor wafer (hereinafter, referred to as a wafer) that is a base of the chips is ground to have a small thickness, and thus strength of the wafer decreases. Therefore, cracking or warping tends to occur in the wafer. In addition, it is difficult to automatically carry the wafer having weak strength due to the reduction in thickness, and thus it is necessary to manually carry the wafer, which makes handling of the wafer troublesome.

In consideration of this situation, the following wafer support system has been developed. In the wafer support system, a plate which is called a supporting member (hereinafter, referred to as a support plate) and which is formed from glass, hard plastic, and the like is bonded to the wafer to be ground, thereby retaining the strength of the wafer to prevent occurrence of cracking and warping in the wafer. The strength of the wafer can be retained by the wafer support system, and thus carrying of the thin wafer can be automatically performed.

The wafer and the support plate are bonded to each other by using an adhesive tape, a thermoplastic resin, an adhesive, and the like, and the support plate is stripped from the wafer before dicing the wafer. At this time, for example, when bonding the wafer and the support plate to each other, in a case of using the adhesive tape, the stripping is performed by detaching the wafer from the support plate. In a case of using the thermoplastic resin, the stripping is performed by melting the resin with a heating treatment. In a case of using the adhesive, the stripping is performed by using a dissolving solution.

In addition, when stripping the support plate from the wafer, a surface of the wafer, which is opposite to a surface to which the support plate is bonded, may be bonded to another supporting member such as a dicing tape in some cases in accordance with a film thickness of the wafer. When the wafer is supported by the dicing tape, even in a case where the film thickness is small and the strength is low, occurrence of cracking and the like can be suppressed.

Contaminants may be attached to the surface of the wafer during a manufacturing process thereof, and thus it is necessary to remove the attached substances and wash the surface of the wafer. Particularly, when stripping the support plate, which is bonded to the wafer with an adhesive, from the wafer, the adhesive and the like may remain on the surface of the wafer. In addition, when dissolving the adhesive, dissolution residual materials derived from a filler in the adhesive may remain in some cases. In addition, in a case where another layer is formed between the wafer and the support plate, residual materials which are derived from the respective layers, may be generated.

However, PTL 1 and PTL 2 do not describe the washing of the wafer without leaving the attached substances and the dissolution residual materials.

Accordingly, development of a technology, which is capable of efficiently washing a wafer without leaving attached substances and dissolution residual materials, has been strongly demanded.

The invention has been made to solve the above-described problems, and an object thereof is to provide a processing method and a processing apparatus which are capable of efficiently washing a substrate such as a wafer.

Solution to Problem

To solve the problem, according to an aspect of the invention, there is provided a processing method of processing a laminate in which a substrate, an adhesive layer, a release layer that is modified when absorbing light, and a supporting member are laminated in this order. The processing method includes: a release layer removing process of modifying the release layer by irradiating the release layer with light, removing the supporting member from the laminate, and applying a stripping solution for removal of the release layer onto the release layer to remove the release layer; and an adhesive layer dissolving process of applying a dissolving solution for dissolution of the adhesive layer onto the adhesive layer to dissolve the adhesive layer.

In addition, according to another aspect of the invention, there is provided a processing apparatus that processes a laminate in which a substrate, an adhesive layer, a release layer that is modified when absorbing light, and a supporting member are laminated in this order. The processing apparatus includes: a release layer removing unit which modifies the release layer by irradiating the release layer with light, removes the supporting member from the laminate, and applies a stripping solution for removal of the release layer onto the release layer to remove the release layer; and an adhesive layer dissolving unit which applies a dissolving solution for dissolution of the adhesive layer onto the adhesive layer to dissolve the adhesive layer.

Advantageous Effects of Invention

According to the invention, it is possible to efficiently wash a substrate without leaving residual materials on the substrate after stripping a supporting member from the substrate that is bonded to the supporting member through an adhesive layer.

BRIEF DESCRIPTION OF DRAWINGS

FIG. 4 is a diagram illustrating the difference in the degree of contamination of the exposed surface when changing an amount of a material that forms a protective film applied onto the exposed surface of the dicing tape.

DESCRIPTION OF EMBODIMENTS

[First Embodiment]
Hereinafter, a first embodiment of the invention will be described in detail.

[Processing Method]
The processing method according to this embodiment is a processing method of processing a laminate in which a substrate, an adhesive layer, a release layer that is modified when absorbing light, and a supporting member are laminated in this order. The processing method includes: a release layer removing process of modifying the release layer by irradiating the release layer with light, removing the supporting member from the laminate, and applying a stripping solution for removal of the release layer onto the release layer to remove the release layer; and an adhesive layer dissolving process of applying a dissolving solution for dissolution of the adhesive layer onto the adhesive layer to dissolve the adhesive layer.

In the laminate which is an object to be processed in the processing method according to this embodiment, a wafer 1, an adhesive layer 10, a release layer 11 that is modified when absorbing light, and a supporting member are laminated in this order. Hereinafter, this embodiment will be described with reference to FIGS. 1A to 1F. FIGS. 1A to 1F are diagrams illustrating a processing flow of the processing method according to the first embodiment of the invention.

Figure 1A:
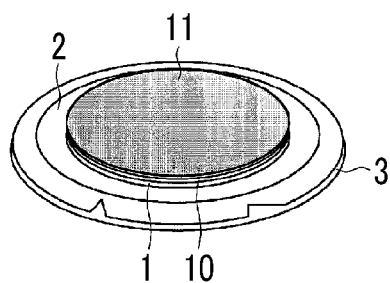
FIGS. 1A to 1F are diagrams illustrating a processing flow of a processing method according to a first embodiment of the invention.

As shown in FIG. 1A, in this embodiment, the above-described laminate is irradiated with light from a supporting member side to modify the release layer 11, and the supporting member is removed from the laminate. Then, the structure body, in which the release layer 11, the adhesive layer 10, and the wafer 1 are laminated in this order, is processed. The removal of the supporting member may be performed in the same apparatus as that with which processing of the structure body is performed. Alternatively, after removing the supporting member in a different apparatus, the structure body may be carried to an apparatus that processes the structure body.

(Wafer 1)
The wafer 1 is a body to be processed which is an object to be washed, and the wafer 1 is attached to a dicing tape 2, to be described later. In addition, the wafer 1 is a substrate in which a circuit (element) is formed. As the wafer 1, a substrate made of a semiconductor that is a material known in the related art may be used. In addition, the processing method according to this embodiment may be applied to a wafer 1 to which the dicing tape 2 is not attached.

(Dicing Tape 2)
The dicing tape 2 may be attached to the wafer 1. The dicing tape 2 is bonded to a surface of the wafer 1, which is opposite to a surface on which an adhesive layer 10 is formed, to reinforce the strength of the wafer 1. As the dicing tape 2, for example, a dicing tape having a configuration in which an adhesive layer is formed on a base film may be used. As the base film, for example, a resin film such as PVC (polyvinyl chloride), polyolefin, and polypropylene may be used.

The dicing tape 2 is larger than the outer diameter of the wafer 1, and when bonding the dicing tape 2 and the wafer 1 to each other, a part of the dicing tape 2 is exposed at an outer edge of the wafer 1. In addition, a dicing frame (frame portion) 3 configured to prevent bending of the dicing tape 2 may be provided at an outer periphery of the exposed surface of the dicing tape 2 that is attached to the wafer 1.

(Supporting Member)
The supporting member may be called a support plate. The supporting member supports the wafer 1 and has optical transparency. Accordingly, when light is emitted toward the supporting member from the outside of the laminate, the light is transmitted through the supporting member and reaches the release layer 11. In addition, it is not necessary for the supporting member to transmit all kinds of light, and it is sufficient that the supporting member may transmit light (having a desired wavelength) to be absorbed to the release layer 11.

The supporting member supports the wafer 1 and there is no limitation as long as the supporting member can transmit specific light. However, for example, the supporting member may be formed from glass, silicon, an acrylic resin, and the like.

(Release Layer 11)
The release layer 11 is a layer formed from a material that is modified when absorbing light emitted through the supporting member. In this specification, "modification" of the release layer 11 represents the following phenomenon. Specifically, the release layer 11 enters a state capable of being broken when receiving a slight external force, or a state in which an adhesive force with a layer that comes into contact with the release layer 11 decreases. In addition, the modification of the release layer 11 may be (pyrogenic or non-pyrogenic) decomposition, crosslinking, a change in configuration, or disassociation of a functional group due to energy of light that is absorbed (including curing, degasification, contraction, or expansion in the release layer due to the phenomenon), and the like. The modification of the release layer 11 occurs resultantly when a material that constitutes the release layer 11 absorbs light. Accordingly, a kind of the modification in the release layer 11 may be changed in accordance with a kind of the material that constitutes the release layer 11.

The release layer 11 is provided on a surface of the side of the supporting member to which the wafer 1 is bonded through the adhesive layer 10. That is, the release layer 11 is provided between the supporting member and the adhesive layer 10.

For example, it is preferable that the thickness of the release layer 11 be 0.05 μm to 50 μm, and more preferably 0.1 μm to 10 μm. When the thickness of the release layer 11 is in a range of 0.05 µm to 50 µm, it is possible to modify the release layer 11 as desired by irradiation of light in a short time and irradiation of light of low energy. In addition, it is preferable that the thickness of the release layer 11 be in a range of 1 µm or less in consideration of productivity.

In addition, it is preferable that the release layer 11 be formed from only a material having a light absorbing structure. However, the release layer 11 may be formed by adding a material not having the light absorbing structure in a range not deteriorating basic characteristics in the invention. In addition, in the release layer 11, it is preferable that a surface on a side facing the adhesive layer 10 be flat (unevenness is not formed). According to this, formation of the release layer 11 can be easily performed, and uniform bonding can be performed.

As the release layer 11, a member, which is formed in a film shape in advance by using a material that constitutes the release layer 11, to be described later, may be used in a state of being bonded to the supporting member, or a member, which is formed by applying a material that constitutes the release layer 11 on the supporting member and which is solidified in a film shape, may be used. A method of applying the material that constitutes the release layer 11 on the supporting member may be appropriately selected from methods known in the related art in accordance with a kind of the material that constitutes the release layer 11.

The release layer 11 may be a member that is modified when absorbing light emitted from laser. That is, light emitted to the release layer 11 to modify the release layer 11 may be light emitted from laser. Examples of the laser that emits light to irradiate the release layer 11 include a laser beam such as solid laser such as YAG laser, ruby laser, glass laser, $YVO_4$ laser, LD laser, and fiber laser; liquid lasers such as dye laser, gas laser such as $CO_2$ laser, excimer laser, Ar laser, and He—Ne laser; semiconductor laser and free electron laser; a non-laser beam; and the like. The laser that emits light to irradiate the release layer 11 may be appropriately selected in accordance with a material that constitutes the release layer 11, and laser, which emits light with a wavelength capable of modifying the material that constitutes the release layer 11, may be selected.

<Polymer Including Light Absorbing Structure in Repeating Unit>

The release layer 11 may contain a polymer including a light absorbing structure in a repeating unit thereof. The polymer is modified when being irradiated with light. The modification of the polymer occurs when the structure absorbs irradiation light. As a result of the modification of the polymer, the release layer 11 loses strength or adhesiveness before irradiation with light. Accordingly, when a slight external force is applied (for example, lifting up the supporting member), the release layer 11 is broken, and thus the supporting member and the wafer 1 can be easily separated from each other.

The light absorbing structure is a chemical structure which absorbs light and modifies a polymer including the structure as a repeating unit. For example, the structure is an atomic group that contains a conjugated π electron system composed of substituted or non-substituted benzene rings, condensed rings, or heterocyclic rings. More specifically, the structure may be a cardo structure, or a benzophenone structure, a diphenyl sulfoxide structure, a diphenyl sulfone structure (a bisphenyl sulfone structure), a diphenyl structure, or a diphenyl amine structure which are present at a side chain of the polymer.

<Inorganic Substance>

The release layer 11 may be composed of an inorganic substance. When the release layer 11 is constituted by the inorganic substance, the release layer 11 is modified when absorbing light, and as a result thereof, the release layer 11 loses strength or adhesiveness before irradiation of light. Accordingly, when a slight external force is applied (for example, lifting up the supporting member), the release layer 11 is broken, and thus the supporting member and the wafer 1 can be easily separated from each other.

The inorganic substance may have a configuration in which modification occurs when absorbing light. For example, as the inorganic substance, one or more kinds of inorganic substances, which are selected from the group consisting of a metal, a metal compound, and carbon, may be appropriately used. The metal compound represents a compound that contains metal atoms. For example, the metal compound may be a metal oxide or a metal nitride. Examples of the inorganic substance include but not limited to, one or more kinds of inorganic substances selected from the group consisting of gold, silver, copper, iron, nickel, aluminum, titanium, chrome, $SiO_2$, SiN, $Si_3N_4$, TiN, and carbon. In addition, the carbon has a concept including allotropes of carbon, and for example, may be diamond, fullerene, diamond-like carbon, a carbon nanotube, and the like.

<Compound Having Infrared Ray Absorbing Structure>

The release layer 11 may be formed from a compound having an infrared ray absorbing structure. The compound is modified when absorbing infrared rays. As a result of the modification of the compound, the release layer 11 loses strength or adhesiveness before irradiation of the infrared rays. Accordingly, when a slight external force is applied (for example, lifting up the support plate), the release layer 11 is broken, and thus the supporting member and the wafer 1 can be easily separated from each other.

Examples of the infrared ray absorbing structure or the compound having the infrared ray absorbing structure include alkane, alkene (vinyl, trans, cis, vinyliden, tri-substituted, tetra-substituted, conjugated, cumulene, cyclic), alkyne (mono-substituted, di-substituted), monocyclic aromatic series (benzene, mono-substituted, di-substituted, tri-substituted), alcohols and phenols (free OH, intramolecular hydrogen bond, intermolecular hydrogen bond, secondary saturated, tertiary saturated, secondary unsaturated, and tertiary unsaturated), acetal, ketal, aliphatic ether, aromatic ether, vinylether, oxirane ring ether, peroxide ether, ketone, dialkylcarbonyl, aromatic carbonyl, enol of 1,3-diketone, o-hydroxyarylketone, dialkylaldehyde, aromatic aldehyde, carboxylic acid (dimers, carboxylate anions), formic acid ester, ester acetate, conjugated ester, non-conjugated ester, aromatic ester, lactone (β-, γ-, δ-), aliphatic acid chloride, aromatic acid chloride, acid anhydride (conjugated, non-conjugated, cyclic, non-cyclic), primary amide, secondary amide, lactam, primary amine (aliphatic, aromatic), secondary amine (aliphatic, aromatic), tertiary amine (aliphatic, aromatic), primary amine salts, secondary amine salts, tertiary amine salts, ammonium ions, aliphatic nitrile, aromatic nitrile, carbodiimide, aliphatic isonitrile, aromatic isonitrile, isocyanic ester, thiocyanic ester, aliphatic isothiocyanic ester, aromatic isothiocyanic ester, aliphatic nitro compounds, aromatic nitro compounds, nitroamine, nitrosamine, nitrate ester, nitrite ester, nitroso bond (aliphatic, aromatic, monomers, dimers), sulfur compounds such as mercaptan, thiophenol, and thiol acid, thiocarbonyl group, sulfoxide, sulfone, sulfonyl chloride, primary sulfone amide, secondary sulfone amide, ester sulfate, carbon-halogen bonds, Si-$A^1$ bonds ($A^1$ is H, C, O, or halogen), P-$A^2$ bonds ($A^2$ is H, C, or O), or Ti—O bonds.

<Fluorocarbon>

The release layer 11 may be composed of fluorocarbon. When the release layer 11 is constituted by fluorocarbon, the release layer 11 is modified when absorbing light, and as a result thereof, the release layer 11 loses strength or adhesiveness before irradiation of light. Accordingly, when a slight external force is applied (for example, lifting up the supporting member), the release layer 11 is broken, and thus the supporting member and the wafer 1 can be easily separated from each other.

In addition, in consideration of one aspect, the fluorocarbon that constitutes the release layer 11 may be appropriately formed in accordance with a plasma CVD method. In addition, the fluorocarbon includes, but not limited to, $C_xF_y$ (perfluorocarbon) and $C_xH_yF_z$ (x, y, and z represent natural numbers), and may be $CHF_3$, $CH_2F_2$, $C_2H_2F_2$, $C_4F_8$, $C_2F_6$, $C_5F_8$, and the like.

In addition, inert gas such as nitrogen, helium, and argon, oxygen, hydrocarbon such as alkane and alkene, carbon dioxide, and hydrogen may be added to the fluorocarbon that is used to constitute the release layer 11 as necessary. In addition, a plurality of these gases may be mixed and used (such as a mixed gas of fluorocarbon, hydrogen, and nitrogen, and the like). In addition, the release layer 11 may be constituted by a single kind of fluorocarbon, or two or more kinds of fluorocarbon.

<Infrared Absorbing Substance>

The release layer 11 may contain an infrared absorbing substance. When the release layer 11 is constituted by containing the infrared absorbing substance, the release layer 11 is modified when absorbing light, and as a result thereof, the release layer 11 loses strength or adhesiveness before irradiation of light. Accordingly, when a slight external force is applied (for example, lifting up the supporting member), the release layer 11 is broken, and thus the supporting member and the wafer 1 can be easily separated from each other.

The infrared absorbing substance may have a configuration in which modification occurs when absorbing infrared rays. For example, carbon black, iron particles, or aluminum particles may be appropriately used.

(Adhesive Layer 10)

The adhesive layer 10 bonds and fixes the wafer 1 to the supporting member, and covers a surface of the wafer 1 to protect the surface. It is preferable that the adhesive layer 10 have adhesiveness and strength for retaining fixing of the wafer 1 to the supporting member and covering of the surface of the wafer 1 to be protected during processing or carrying of the wafer 1. On the other hand, fixing of the wafer 1 to the supporting member becomes unnecessary after a manufacturing process and the like. Accordingly, as shown in FIG. 1A, it is preferable that the adhesive layer be easily separated or removed from the wafer 1 after separating the supporting member from the laminate.

An adhesive that forms the adhesive layer 10 is not particularly limited as long as an adhesive resin is contained. In addition, the adhesive layer 10 may contain a filler and the like in addition to the adhesive.

Examples of the adhesive resin include gelatin, cellulose, cellulose ester (for example, cellulose acetate, nitrocellulose), polyphenol, polyvinyl butyral, polyvinyl acetal, polycarbonate, polyurethane, polyester, polyorthoester, polyacetal, polyvinyl alcohol, polyvinyl pyrrolidone, a copolymer of vinylidene chloride and acrylonitrille, poly(meth)acrylate, polyvinyl chloride, a silicone resin, a block copolymer having a polyurethane unit, and the like. These resins may be used alone or two or more kinds thereof may be mixed and used.

Examples of the filler include silica, alumina, zinc oxide, titanium oxide, calcium oxide, magnesium oxide, iron oxide, tin oxide, antimony oxide, ferrites, calcium hydroxide, magnesium hydroxide, aluminum hydroxide, basic magnesium carbonate, calcium carbonate, zinc carbonate, barium carbonate, dawsonite, hydrotalcite, calcium sulfate, barium sulfate, calcium silicate, talc, clay, mica, montmorillonite, bentonite, sepiolite, imogolite, sericite, a glass fiber, a glass bead, silica-based balloon, aluminum nitride, boron nitride, silicon nitride, carbon black, graphite, a carbon fiber, carbon balloon, zinc borate, various magnetic powders, and the like.

In addition, the adhesive may be prepared by mixing the resin and the filler by using a known method. At this time, a solution that is diluted with an organic solvent may be used as necessary.

Examples of the organic solvent include ketones such as acetone, methyl ethyl ketone, cyclohexanone, methyl isoamyl ketone, and 2-heptanone; polyhydric alcohols and derivatives thereof such as monomethyl ether, monoethyl ether, monopropyl ether, monobutyl ether, and monophenyl of ethylene glycol, ethylene glycol monoacetate, diethylene glycol, diethylene glycol monoacetate, propylene glycol, propylene glycol monoacetate, dipropylene glycol, or dipropylene glycol monoacetate; cyclic ethers such as dioxane; esters such as methyl lactate, ethyl lactate, methyl acetate, ethyl acetate, butyl acetate, methyl pyruvate, ethyl pyruvate, methyl methoxypropionate, and ethyl ethoxypropionate; terpene-based solvents; and the like. These organic solvents may be used alone or two or more kinds thereof may be mixed and used.

Examples of the terpene-based solvent include α-pinene, camphene, pinane, myrcene, dihydromyrcene, p-menthane, 3-carene, p-menthadiene, α-terpinene, β-terpinene, α-phellandrene, ocimene, limonene, p-cymene, γ-terpinene, terpinolene, 1,4-cineole, 1,8-cineole, rose oxide, linalool oxide, fenchone, α-cyclocitral, ocimenol, tetrahydrolinalool, linalool, tetrahydromugol, isopulegol, dihydrolinalool, isodihydrolavandulol, β-cyclocitral, citronellal, L-menthone, linalyl formate, dihydroterpineol, β-terpineol, menthol, myrcenol, L-menthol, pinocarveol, α-terpineol, γ-terpineol, nopol, myrtenol, dihydrocarveol, citronellol, myrtenal, dihydrocarvone, d-pulegone, geranyl ethyl ether, geranyl formate, neryl formate, terpinyl formate, isodihydro lavandulyl acetate, terpinyl acetate, linalyl acetate, mycenyl acetate, bornyl acetate, menthyl propionate, linalyl propionate, nerol, carveol, perillylalcohol, geraniol, safranal, citral, perillaldehyde, citronellyloxyacetaldehyde, hydroxycitronellal, verbenone, d-carvone, L-carvone, piperitone, piperitenone, citronellyl formate, isobornyl acetate, menthyl acetate, citronellyl acetate, carvyl acetate, dimethyloctanyl acetate, nellyl acetate, isopulegol acetate, dihydrocarvyl acetate, nopyl acetate, geranyl acetate, bornyl propionate, neryl propionate, carvyl propionate, terpinyl propionate, citronellyl propionate, isobornyl propionate, linalyl isobutyrate, neryl isobutyrate, linalyl butyrate, neryl butyrate, terpinyl isobutyrate, terpinyl butyrate, geranyl isobutyrate, citronellyl butyrate, citronellyl hexanoate, menthyl isovalerate, β-caryophyllene, cedrene, bisabolene, hydroxycitronellol, farnesol, and rhodinyl isobutyrate. From the viewpoint of solubility, among these, limonene and p-menthane are more preferable, and p-menthane is particularly preferable.

Respective processes of the processing method according to the first embodiment will be described with reference to FIGS. 1A to 1F.

As shown in FIG. 1A, after the laminate is irradiated with light to modify the release layer 11, and the supporting member is removed, the wafer 1 is placed on, for example, a spin cup (not shown) in such a manner that the release layer 11 is exposed.

Figure 1D:
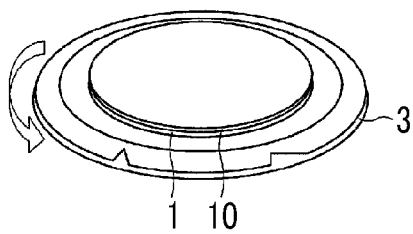
Figure 1B:
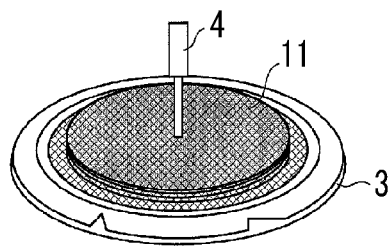

Next, as shown in FIG. 1B, a stripping solution that removes the release layer 11 is applied onto the wafer 1 from a nozzle 4, thereby removing the release layer (a release layer removing process). At this time, it is preferable to apply the stripping solution while rotating the wafer 1 by rotating the spin cup on which the wafer 1 is placed so as to allow the stripping solution to more efficiently spread on the release layer 11. With regard to an aspect of applying the stripping solution onto the release layer 11, the stripping solution may be applied by various methods such as a spray application and a slit application without being limited to spin applications.

(Stripping Solution)

Here, the stripping solution that is applied onto the release layer 11 may be a solution capable of removing the release layer 11, and it is not necessary for the stripping solution to be a material that also dissolves the adhesive layer 10. In other words, it is preferable that the stripping solution be a material that does not dissolve the adhesive layer 10, that is, a material that substantially does not have compatibility with the adhesive layer 10. According to this, the release layer 11 can be stripped in a relatively easy manner.

In this manner, it is possible to use a stripping solution capable of reliably dissolving the release layer 11 without consideration of a material of the adhesive layer 10, and thus the release layer can be reliably removed. As a result, it is possible to prevent dissolution residual materials of the release layer 11 from remaining on the wafer 1.

The stripping solution is more preferably a solution that shows alkalinity. The solution that shows the alkalinity is more preferably an amine-based compound. As the amine-based compound, at least one kind of compound selected from the group constituting of primary, secondary, and tertiary aliphatic amines, alicyclic amines, aromatic amines, and heterocyclic amines may be used.

Examples of the primary aliphatic amines include monomethanolamine, monoethanolamine (MEA), monoisopropanolamine, ethylenediamine, 2-(2-aminoethoxy)ethanol (DGA), and 2-(2-amino-ethylamino)ethanol; examples of the secondary aliphatic amines include 2-(methylamino)ethanol (MMA), diethanolamine, iminobispropylamine, and 2-ethylaminoethanol; and examples of the tertiary aliphatic amines include triethanolamine, triisopropanolamine, and diethylaminoethanol.

Furthermore, examples of the alicyclic amines include cyclohexylamine and dicyclohexylamine. Examples of the aromatic amines include benzylamine, dibenzylamine, and N-methylbenzylamine. Examples of the heterocyclic amines include N-hydroxyethylpiperidine, and 1,8-diazabicyclo[5,4,0]-7-undecene. Among the compounds of the organic amines, alkanolamines such as monoethanolamine, 2-(2-aminoethoxy)ethanol, 2-ethylaminoethanol, and 2-(methylamino)ethanol (MMA) are particularly preferable.

Moreover, the stripping solution may be used in a mixture with other solvents. Examples of the solvent that may be mixed with the above-described stripping solution include organic solvents of lactones such as γ-butyrolactone, ketones such as acetone, methyl ethyl ketone, cyclohexanone, methyl-n-pentyl ketone, methyl isopentyl ketone, and 2-heptanone, polyhydric alcohols such as ethylene glycol, diethylene glycol, propylene glycol, and dipropylene glycol, and compounds having ester bonds, such as ethylene glycol monoacetate, diethylene glycol monoacetate, propylene glycol monoacetate, and dipropylene glycol monoacetate, or the like; organic solvents of derivatives of the polyhydric alcohols such as compounds having ether bonds, such as monoalkyl ether such as monomethyl ether, monoethyl ether, monopropyl ether, and monobutyl ether or monophenyl ether of the polyhydric alcohols or the compounds having the ester bonds, cyclic ethers such as dioxane, and esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents of anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, mesitylene, and the like; and aprotic organic solvents such as N-methyl-2-pyrrolidone (NMP), N-ethyl-2-pyrrolidone (NEP), dimethyl sulfoxide (DMSO) and the like.

Further, as the solvent that may be mixed with the above-described stripping solution, among those, preferred is at least one selected from the aprotic organic solvents, the polyhydric alcohols, the compounds having ester bonds, or the derivatives of the polyhydric alcohols, and more preferred is at least one selected from N-methyl-2-pyrrolidone (NMP), N-ethyl-2-pyrrolidone (NEP), dimethyl sulfoxide (DMSO), diethylene glycol monomethyl ether, triethylene glycol dimethyl ether, diethylene glycol diethyl ether, ethylene glycol monobutyl ether, propylene glycol monopropyl ether, diethylene glycol methyl ethyl ether, dipropylene glycol monomethyl ether, ethylene glycol monoisopropyl ether, ethylene glycol monoisobutyl ether, diethylene glycol dimethyl ether, propylene glycol monoethyl ether, propylene glycol monomethyl ether (PGME), butyl diglycol, propylene glycol monomethyl ether acetate (PGMEA), or propylene glycol monoethyl ether acetate.

A mixing ratio between the solution that shows alkalinity and the solvent that may be mixed to the stripping solution is 95:5 to 5:95 in terms of weight ratio, preferably 80:20 to 5:95, more preferably 8:2 to 2:8, and particularly preferably 5:5 to 2:8. In the mixing ratio, stripping properties and handling properties are excellent.

Figure 1E:
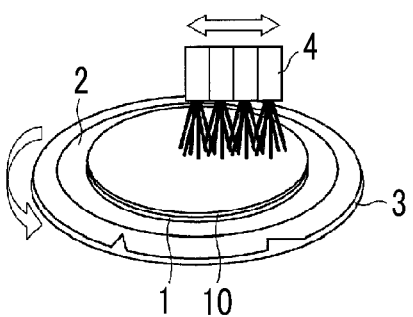
Figure 1C:
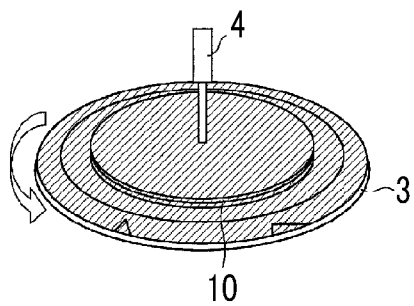

After removing the release layer 11 as shown in FIG. 1B, as shown in FIG. 1C, a washing solution, which removes the stripping solution that remains on the adhesive layer 10, may be applied onto the adhesive layer 10 from the nozzle 4 (a washing process). At this time, it is preferable to apply the washing solution while rotating the wafer 1 by rotating the spin cup on which the wafer 1 is placed so as to allow the washing solution to more efficiently spread on the adhesive layer 10. With regard to an aspect of applying the washing solution onto the release layer 11, the washing solution may be applied by various methods such as a spray application and a slit application without being limited to spin applications.

(Washing Solution)

Here, the washing solution removes the stripping solution that remains on the adhesive layer 10 and the wafer 1 after removal of the release layer 11. The washing solution is not particularly limited as long as the washing solution can wash away and remove the remaining stripping solution from the adhesive layer 10 and the wafer 1, and examples of the washing solution include pure water, alcohol having 1 to 6 carbon atoms, and the like.

In a case where the stripping solution remains after stripping the release layer 11, for example, the alkaline stripping solution may be attached to the wafer 1, and thus there is a concern that the wafer may be corroded. In this embodiment, washing by the washing solution is performed after stripping the release layer 11 to remove the stripping solution that remains, and thus the wafer is not corroded by the stripping solution. In addition, the stripping solution that remains is removed, and thus dissolution of the adhesive layer 10 by a dissolving solution that is subsequently applied is not hindered by the stripping solution. As a result, dissolubility of the adhesive layer 10 is also improved.

After removing the release layer 11 and washing the stripping solution that remains, as shown in FIG. 1D, the adhesive layer 10 may be dried (a drying process). When the adhesive layer 10 is dried, it is possible to prevent the washing solution and the adhesive that forms the adhesive layer 10 or the dissolving solution that is subsequently applied from being mixed with each other.

A method of drying the adhesive layer 10 is not particularly limited, and the adhesive layer 10 may be dried naturally or by using an oven or a hot plate, or the adhesive layer 10 may be dried by being exposed to warm air. In addition, the adhesive layer 10 may be rotationally dried by rotating the wafer 1.

Next, as shown in FIG. 1E, the dissolving solution that dissolves the adhesive layer 10 is applied onto the adhesive layer 10 from the nozzle 4 to dissolve the adhesive layer 10 (a dissolving process). At this time, it is preferable to apply the dissolving solution while rotating the wafer 1 by rotating the spin cup on which the wafer 1 is placed so as to allow the dissolving solution to more efficiently spread on the adhesive layer 10. With regard to an aspect of applying the dissolving solution onto the adhesive layer 10, the dissolving solution may be applied by various methods such as a spray application and a slit application without being limited to spin applications.

(Dissolving Solution)

Here, the dissolving solution to be applied onto the adhesive layer 10 is not limited as long as the dissolving solution is capable of dissolving the adhesive layer 10, and examples thereof include linear hydrocarbons such as hexane, heptane, octane, nonane, methyloctane, decane, undecane, dodecane, and tridecane, branched hydrocarbons having 3 to 15 carbon atoms; and cyclic hydrocarbons (terpen), such as monoterpenes such as geraniol, nerol, linalool, citral, citronellol, p-menthane, o-menthane, m-menthane, diphenyl menthane, menthol, isomenthol, neomenthol, limonene, α-terpinene, β-terpinene, γ-terpinene, α-terpineol, β-terpineol, γ-terpineol, terpinen-1-ol, terpinen-4-ol, 1,4-terpin, 1,8-terpin, carvone, ionone, thujone, camphor, bornane, borneol, norbornane, pinane, α-pinene, β-pinene, thujane, α-thujone, β-thujone, calane, camphor, longifolene, 1,4-cineole, and 1,8-cineole, and diterpenes such as abietane and abietic acid.

In addition, as described above, the stripping solution, the washing solution, and the dissolving solution may be ejected from the same nozzle 4, and may be ejected from different nozzles, respectively. That is, dedicated nozzles for ejection of the respective solutions, as many as the kinds of the solutions, may be used.

In addition, as shown in FIG. 1B, the nozzle 4 may be fixed in the vicinity of the center of a body to be processed that is an object to which a solution is applied on an upper side of the body to be processed, and the solution may be ejected toward the center of the body to be processed. In addition, as shown in FIG. 1E, the nozzle 4 may eject the solution during swing movement above an end of the body to be processed from above the center of the body to be processed. When the nozzle 4 ejects the solution during swing movement over the body to be processed, it is possible to allow the solution to more reliably spread on the entirety of the body to be processed.

Figure 1F:
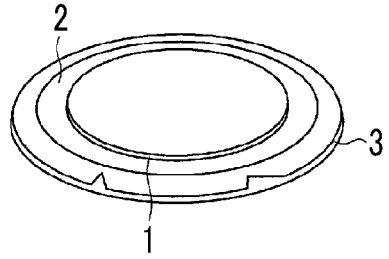

When applying the dissolving solution as shown in FIG. 1E, the adhesive layer 10 on the wafer 1 is removed as shown in FIG. 1F.

As described above, since the adhesive layer 10 is removed by applying the dissolving solution after removing the release layer 11 by applying the stripping solution, it is possible to prevent respective dissolution residual materials of the release layer 11 and the adhesive layer 10 from being attached onto the wafer 1, and thus it is possible to efficiently wash the wafer 1. In addition, it is possible to further reduce an amount of a liquid that is used to remove the respective layers and it is possible to further shorten a time necessary for a removal process in comparison to a case in which the adhesive layer 10 and the release layer 11 are removed by using only a dissolving solution that dissolves an adhesive similar to the related art.

[Processing Apparatus]

The processing apparatus according to this embodiment is a processing apparatus that processes the laminate in which the substrate, the adhesive layer, the release layer that is modified when absorbing light, and the supporting member are laminated in this order. The processing apparatus includes a release layer removing unit which modifies the release layer by irradiating the release layer with light, removes the supporting member from the laminate, and applies the stripping solution for removal of the release layer onto the release layer to remove the release layer, and an adhesive layer dissolving unit which applies the dissolving solution for dissolution of the adhesive layer onto the adhesive layer to dissolve the adhesive layer.

That is, the processing apparatus according to this embodiment is an embodiment of an apparatus that is used in the processing method according to this embodiment, and thus a description of the processing apparatus according to this embodiment conforms to the description of the processing method according to the above-described embodiment.

For example, the release layer removing unit may be a unit provided with the nozzle 4 that ejects the stripping solution as shown in FIG. 1B, and the adhesive layer dissolving unit may be a unit provided with the nozzle 4 that ejects the dissolving solution as shown in FIG. 1E. In addition, the processing apparatus according to this embodiment may be provided with a washing unit including the nozzle 4 that ejects the washing solution as shown in FIG. 1C, and a drying unit that dries the adhesive layer 10 as shown in FIG. 1D.

[Second Embodiment]

[Processing Method]

A processing method according to a second embodiment of the invention will be described with reference to FIGS. 2A to 2E. FIGS. 2A to 2E are diagrams illustrating a processing flow of the processing method according to the second embodiment of the invention. This embodiment is different from the first embodiment in that this embodiment includes a protective film forming process of forming a protective film on an exposed surface of the dicing tape 2. Accordingly, in this embodiment, a configuration different from that of the first embodiment will be described in detail, and a detailed description with respect to the same configuration as the first embodiment will not be repeated. In addition, the same reference numerals are given to the same members as the first embodiment, and a description thereof will not be repeated.

Figure 2A:
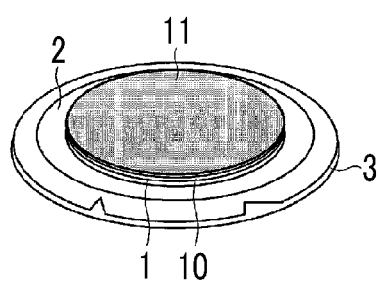
FIGS. 2A to 2E are diagrams illustrating a processing flow of a processing method according to a second embodiment of the invention.

First, the laminate is irradiated with light from a supporting member side to modify the release layer 11, and the supporting member is removed from the laminate. Then, as shown in FIG. 2A, the wafer 1 is placed, for example, on a spin cup (not shown) in such a manner that the release layer 11 is exposed.

Figure 2D:
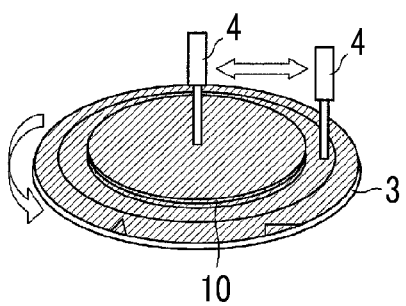
Figure 2B:
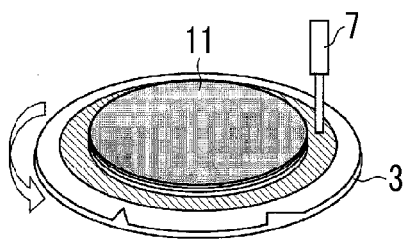

Next, as shown in FIG. 2B, before removing the release layer 11, a material that forms a protective film is ejected onto the exposed surface of the dicing tape 2 from a nozzle 7 to form the protective film (a protective film forming process). The protective film is formed on the exposed surface, to which the wafer 1 is not attached, on a surface of the side of the dicing tape 2 to which the wafer 1 is attached. In addition, a nozzle, which ejects the material that forms the protective film, may be the same nozzle as the nozzle 4 which ejects the following stripping solution. In addition, the material that forms the protective film may be applied onto the exposed surface of the dicing tape 2 by hand.

(Protective Film)

Here, the protective film prevents the stripping solution, which is applied during removal of the release layer 11, from being attached to the dicing tape 2 to prevent the dicing tape 2 from being contaminated due to the stripping solution. In addition, the protective film also prevents a dissolved material of the release layer 11, which is dissolved due to application of the stripping solution, from being attached to the dicing tape 2.

Accordingly, it is preferable that the protective film be formed from a material that is insoluble or poorly soluble in the stripping solution. In addition, it is preferable that the material that forms the protective film be soluble in water. As the water-soluble material, for example, at least one kind of water-soluble resin selected from the group consisting of an acrylic resin, a vinyl-based resin, a cellulosic resin, and an amid-based resin may be used.

Examples of the acrylic resin include polymers or copolymers containing monomers such as acrylic acid, methyl acrylate, methacrylic acid, methyl methacrylate, N,N-dimethylacrylamide, N,N-dimethylaminopropyl methacrylamide, N,N-dimethylaminopropylacrylamide, N-methylacrylamide, diacetone acrylamide, N,N-dimethylaminoethyl methacrylate, N,N-diethylaminoethyl methacrylate, N,N-dimethylaminoethyl acrylate, and acryloyl morpholine as the constitutional component.

Examples of the vinyl-based resin include polymers and copolymers containing monomers such as N-vinyl pyrrolidone, vinyl imidazolidinone, and vinyl acetate as the constitutional component.

Examples of cellulosic resin include hydroxypropylmethylcellulose phthalate, hydroxypropylmethylcellulose acetate phthalate, hydroxypropylmethylcellulose hexahydrophthalate, hydroxypropylmethylcellulose acetate succinate, hydroxypropylmethyl cellulose, hydroxypropyl cellulose, hydroxyethyl cellulose, cellulose acetate hexahydrophthalate, carboxymethyl cellulose, ethyl cellulose, and methyl cellulose.

In addition, among amid-based resins, water-soluble resins also may be used. Among these, a vinyl-based resin is preferable, and polyvinylpyrrolidone or polyvinylalcohol is particularly preferable.

These water-soluble resins may be used alone, or two or more kinds thereof may be mixed and used. Among the resins, a resin which decreases adhesive strength of the dicing tape on which the protective film is formed to preferably 50% or less, more preferably 30% or less, of adhesive strength before forming the protective film, is used.

In addition, it is preferable that the thickness of the protective film be 0.1 µm to 5 µm, and more preferably 0.2 µm to 2 µm.

In addition, the material that forms the protective film may be supplied to cover at least the exposed surface of the dicing tape 2. However, it is preferable to supply the material that forms the protective film in such a manner that a boundary surface between the dicing tape 2 and the dicing frame 3 is covered with the material, and the protective film is formed on the boundary surface. According to this, it is possible to prevent the stripping solution or the dissolved material of the release layer from being attached to the boundary surface between the dicing tape 2 and the dicing frame 3 during removal of the release layer.

In addition, masking processing may be performed in advance on the surface of the release layer 11 before supplying the material that forms the protective film. According to this, the protective film is formed on the surface of the release layer 11, and thus it is possible to prevent a problem in which the release layer 11 is not sufficiently removed by the stripping solution.

In addition, the body to be processed may be rotated while supplying the material that forms the protective film. According to this, the material, which is ejected, can efficiently spread on the dicing tape 2. In addition, the dicing tape may be irradiated with ultraviolet rays before supplying the material to the dicing tape. According to this, it is possible to improve wettability of the material to the dicing tape.

After supplying the material that forms the protective film to the exposed surface, the material is dried, whereby the protective film is formed. The drying may be natural drying. However, for example, the drying may be performed while rotating the body to be processed. In addition, a method of drying the material is not limited thereto, and for example, the material may be dried by using an oven or a hot plate, or the material may be dried by being exposed to warm air.

Figure 2E:
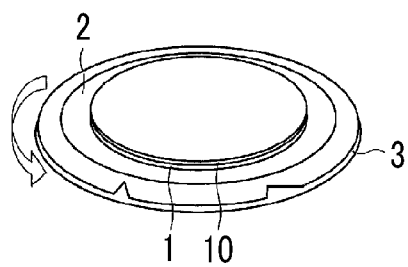
Figure 2C:
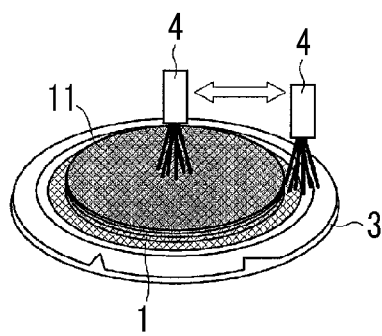

Next, as shown in FIG. 2C, the stripping solution is applied onto the release layer 11 from the nozzle 4 to remove the release layer 11. At this time, the dicing tape 2 is protected by the protective film, and thus it is possible to prevent contamination of the dicing tape 2 due to attachment of the stripping solution or the dissolved material of the release layer 11.

Next, as shown in FIG. 2D, the washing solution is applied onto the adhesive layer 10 from the nozzle 4 to wash the adhesive layer 10. According to this, the stripping solution that remains on the adhesive layer 10 is removed. At this time, when the protective film is formed from a water-soluble material, it is possible to remove the protective film from the dicing tape 2 while removing the remaining stripping solution by using a washing solution such as pure water.

In addition, as shown in FIG. 2E, the adhesive layer 10 after the washing is dried. Then, although not shown in the drawing, in this embodiment, it is also possible to dissolve the adhesive layer 10 through the dissolving process shown in FIG. 1E, and as a result thereof, it is possible to obtain the wafer 1 that is washed as shown in FIG. 1F.

In the processing method according to this embodiment, since the protective film is formed on the exposed surface of the dicing tape 2, it is possible to prevent the dicing tape 2 from being contaminated due to attachment of the stripping solution and the dissolved material of the release layer 11 to the dicing tape 2 during removal of the release layer 11 by using the stripping solution.

[Processing Apparatus]

The processing apparatus according to this embodiment is different from the processing apparatus of the first embodiment in that in the substrate, the dicing tape is bonded to a surface opposite to a surface on which the adhesive layer is formed, and the processing apparatus according to this embodiment further includes the protective film forming unit that forms the protective film on the exposed surface, to which the substrate is not bonded, on a surface of the side of the dicing tape to which the substrate is bonded before application of the stripping solution by the release layer removing unit.

That is, the processing apparatus according to this embodiment is an embodiment of an apparatus that is used in the processing method according to this embodiment, and thus a description of the processing apparatus according to this embodiment conforms to the description of the processing apparatus according to the above-described embodiment.

For example, the protective film forming unit may be a unit provided with the nozzle 7 configured to eject the material that forms the protective film as shown in FIG. 2B. The protective film forming unit may be further provided with an oven, a hot plate, and the like to dry the ejected material that forms the protective film.

[Third Embodiment]

This embodiment is different from the second embodiment in that this embodiment includes a process of forming a protective film containing a material, which is insoluble in the dissolving solution, on the exposed surface of the dicing tape 2 between the washing process of applying the washing solution that removes the stripping solution and the adhesive layer dissolving process of applying the dissolving solution that dissolves the adhesive layer 10. Accordingly, in this embodiment, a configuration different from that of the second embodiment will be described in detail, and a detailed description with respect to the same configuration as the second embodiment will not be repeated. In addition, the same reference numerals are given to the same members as the second embodiment, and a description thereof will not be repeated.

The processing method according to this embodiment includes a first protective film forming process of forming a protective film containing a material, which is insoluble in the stripping solution, on the exposed surface of the dicing tape (corresponding to the protective film forming process of the second embodiment) before the release layer removing process, and further includes a second protective film forming process of forming a protective film containing a material, which is insoluble in the dissolving solution, on the exposed surface of the dicing tape between the washing process and the adhesive layer dissolving process.

In a case where the protective film that is formed in the first protective film forming process is formed from a water-soluble material, when using pure water as the washing solution that removes the stripping solution in the washing process, the protective film is dissolved in the washing solution, and thus the protective film is removed. Accordingly, the outer peripheral portion of the dicing tape 2 is exposed after the washing process.

In addition, after the drying process of drying the adhesive layer 10, the protective film containing the material, which is insoluble in the dissolving solution, is formed on the exposed surface of the dicing tape 2 in the second protective film forming process. That is, before the adhesive layer dissolving process, the protective film containing the material, which is insoluble in the dissolving solution, is formed on the exposed surface of the dicing tape 2. According to this, it is possible to prevent the dissolving solution applied in the subsequent adhesive layer dissolving process and the dissolved material of the adhesive layer from being attached to the exposed surface of the dicing tape 2. In addition, the protective film in the second protective film forming process can be formed by the same method as the first protective film forming process (the protective film forming process of the second embodiment).

The protective film, which is formed in the second protective film forming process, is not limited as long as it contains the material that is insoluble in the dissolving solution. In addition, the protective film, which is formed in the second protective film forming process, may be formed from the same material as the protective film that is formed in the first protective film forming process.

In addition, after the adhesive layer dissolving process, a liquid (pure water and the like in a case where the protective film is soluble in water) that dissolves the protective film is applied onto the protective film, thereby removing the protective film.

In the processing method according to this embodiment, since the protective film is formed on the exposed surface of the dicing tape 2 before removing of the release layer 11 and before dissolving of the adhesive layer 10, it is possible to prevent the dicing tape 2 from being contaminated due to attachment of the stripping solution, the dissolved material of the release layer 11, the dissolving solution, and the dissolved material of the adhesive layer 10 to the dicing tape 2.

In addition, the processing apparatus that is used in the processing method according to this embodiment is also included in the scope of the invention.

[Fourth Embodiment]

This embodiment is different from the second embodiment in that the stripping solution is applied onto the release layer while supplying a protective solution that prevents attachment of the stripping solution instead of forming the protective film on the exposed surface of the dicing tape 2. Accordingly, in this embodiment, a configuration different from that of the second embodiment will be described in detail, and a detailed description with respect to the same configuration as the second embodiment will not be repeated. In addition, the same reference numerals are given to the same members as the second embodiment, and a description thereof will not be repeated.

In the processing method according to this embodiment, the stripping solution is applied onto the release layer while supplying the protective solution that prevents the attachment of the stripping solution to the exposed surface of the dicing tape in the release layer removing process.

(Protective Solution)

Here, the protective solution is not particularly limited as long as the protective solution is a liquid which is capable of preventing the stripping solution from being attached to the exposed surface of the dicing tape 2 and which does not contaminate the dicing tape 2. For example, pure water, alcohol having 1 to 6 carbon atoms, and the like may be used, and the pure water is preferably used.

When applying the stripping solution onto the release layer 11 to remove the release layer 11, the protective solution is supplied to the exposed surface of the dicing tape 2, whereby the protective solution protects the exposed surface of the dicing tape 2. That is, in the processing method according to this embodiment, since the stripping solution is applied onto the release layer 11 while supplying the protective solution onto the exposed surface of the dicing tape 2, it is possible to prevent contamination of the dicing tape 2 due to the stripping solution and the dissolved material of the release layer 11. An amount of the protective solution that is supplied to the exposed surface of the dicing tape 2 may be increased to more reliably prevent the contamination of the exposed surface of the dicing tape 2.

In addition, the dissolving solution may be applied onto the adhesive layer 10 while supplying the protective solution to the exposed surface of the dicing tape 2.

In addition, the processing apparatus that is used in the processing method according to this embodiment is also included in the scope of the invention.

Hereinafter, Examples will be described, and the embodiments of the invention will be described in more detail. It is needless to say that the invention is not limited to the following Examples, and various aspects are possible as details. In addition, the invention is not limited to the above-described embodiments, and various modifications can be made in a range described in the claims. In addition, embodiments obtained by appropriately combining technical units described in the respective embodiments are also included in the technical scope of the invention. In addition, the contents of the entire patent literatures described in this specification are incorporated herein by reference.

EXAMPLES

Example 1

A laminate was prepared as described below.
(Preparation of Laminate)
TZNR-3007 (trade name, manufactured by TOKYO OHKA KOGYO Co., Ltd.) as an adhesive composition was spin-applied to a 12-inch silicon wafer substrate (thickness: 775 μm), and baking was performed at 100° C., 160° C., and 220° C. for three minutes, respectively, to form an adhesive layer (thickness: 50 μm). Next, as the release layer, a fluorocarbon film (thickness: 1 μm) was formed on a supporting member (12-inch glass substrate, thickness: 700 μm) by a CVD method using $C_4F_8$ as a reaction gas under conditions of a flow rate of 400 sccm, a pressure of 700 mTorr, high-frequency power of 2500 W, and a film forming temperature of 240° C.

In addition, the wafer substrate and the supporting member including the release layer were bonded to each other through the adhesive layer, thereby preparing the laminate in which the wafer substrate, the adhesive layer, the release layer, and the supporting member were laminated in this order. Then, the wafer substrate in the laminate was ground (thickness after grinding: 50 μm).

(Separation of Supporting Member)
Next, $YVO_4$ laser having a wavelength of 532 nm was emitted toward the release layer from a supporting member side in the laminate. The release layer was modified by irradiation of the laser, and the supporting member was removed from the laminate. After removing the supporting member, a material that constituted the modified release layer remained on the adhesive layer.

Next, the material that constituted the release layer was removed by using 10 cc of mixed solvent of MMA: PGME=3:7 (weight ratio) as the stripping solution. In addition, after removing the material that constituted the release layer, the adhesive layer was dissolved by using 192 cc of p-methane as the dissolving solution. A total process time taken to dissolve and remove the release layer and adhesive layer was 365 seconds. As a result thereof, the material that constituted the release layer was not attached to the wafer substrate, and thus it was possible to prevent contamination of the wafer substrate.

For comparison, from a laminate, which was prepared under the same conditions as Example 1 and in which the release layer was modified, the release layer and the adhesive layer were removed by using 700 cc of p-methane as the dissolving solution without using the stripping solution. A total process time taken to remove the release layer and the adhesive layer was 840 seconds. As a result thereof, the material that constituted the release layer was attached to a surface of the wafer substrate.

In this manner, in a case where the stripping solution was applied onto the release layer to remove the release layer, and then the dissolving solution was applied onto the adhesive layer to dissolve the adhesive layer, it was possible to shorten a time taken to remove the release layer and the adhesive layer, and it was possible to dissolve the adhesive layer in a small amount of dissolving solution. In addition, dissolution of the adhesive layer was not hindered by a dissolved material of the release layer, and thus it can be said that the adhesive layer was efficiently dissolved.

Example 2

With respect to a case where the stripping solution was applied to the release layer while supplying the protective solution to the exposed surface of the dicing tape, a degree of contamination of the dicing tape was examined.

A laminate, in which a 12-inch silicon wafer substrate (thickness: 775 μm), an adhesive layer (thickness: 50 μm), a release layer (thickness: 1 μm), and a supporting member (a 12-inch glass substrate, thickness: 700 μm) were laminated in this order, was prepared. The adhesive layer and the release layer were prepared in the same manner as Example 1. A dicing tape having a size larger than the outer diameter of the wafer substrate was attached to the wafer substrate in such a manner that the dicing tape was exposed to the outer edge of the wafer, and then a dicing frame was provided at a further outer edge of the exposed surface of dicing tape. In addition, the laminate was formed in the same manner as Example 1, and thus a description with respect to the preparation of the laminate will not be repeated.

(Preparation of Supporting Member)
Next, $YVO_4$ laser having a wavelength of 532 nm was emitted toward the release layer from a supporting member side in the laminate. The release layer was modified by irradiation of the laser, and the supporting member was removed from the laminate. After removing the supporting member, the modified release layer remained on the adhesive layer.

(Protection with Pure Water)
Next, in a state in which pure water was supplied to the exposed surface of the dicing tape, 10 cc of mixed solvent of MMA:PGME=3:7 (weight ratio) was applied onto the release layer as the stripping solution to remove the release layer. In addition, the pure water was supplied to the exposed surface under the following conditions (i) to (iii): (i) 100 cc of pure water was applied (water guard (100 cc)), (ii) 250 cc of pure water was applied (water guard (250 cc)), and (iii) 1000 cc of pure water was applied (water guard (1000 cc)). In addition, as Comparative Example (without guard processing), the stripping solution was applied onto the release layer without protection of the exposed surface with the pure water. After removing the release layer, a degree of contamination of the exposed surface of the dicing tape due to attached materials was confirmed with a naked eye and a microscope, respectively. Results thereof are shown in FIG. 3.

Figure 3:
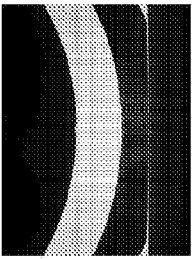
FIG. 3 is a diagram illustrating a difference in a degree of contamination of an exposed surface when changing an amount of pure water that is supplied to the exposed surface of a dicing tape.
Figure 3:
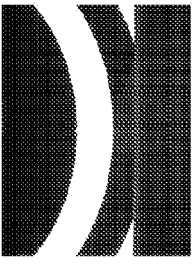
Figure 3:
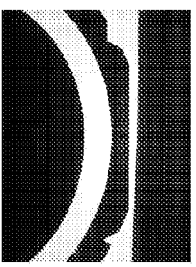
Figure 3:
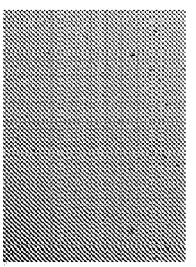
Figure 3:
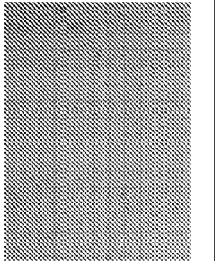
Figure 3:
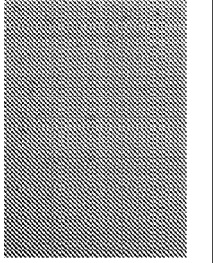

FIG. 3 is a diagram illustrating a difference in the degree of contamination of the exposed surface when changing an amount of the pure water that is supplied to the exposed surface of the dicing tape. In FIG. 3, general view photographs and microscope photographs after removing the release layer are shown. In addition, Comparative Example, and processing results under conditions (i) to (iii) are shown in this order from a left-sided photograph.

The degree of contamination of the exposed surface of the dicing tape was determined on the basis of the general view photographs and the microscope photographs. The determination on the degree of contamination was evaluated by five levels from 1 to 5. "1" represents the highest degree of contamination. As the number increases from "1" to "5", the degree of contamination decreases. "5" represents the lowest degree of contamination.

In Comparative Example, after removing the release layer, contamination of the exposed surface of the dicing tape was seen as shown in both of the general view photographs and the microscope photographs. However, in a case of performing processing under the conditions (i) to (iii) of Examples, as shown in both of the general view photographs and the microscope photographs, contamination of the exposed surface of the dicing tape was more improved. In addition, when an amount of the pure water increased, contamination of the exposed surface was further improved.

Example 3

With respect to a case where the stripping solution was applied onto the release layer after forming the protective film on the exposed surface of the dicing tape, the degree of contamination of the dicing tape was examined. Preparation of the laminate and separation of the supporting member were performed in the same manner as Example 2.

(Formation of Protective Film)

Next, after separating the supporting member, TPF (trade name, manufactured by TOKYO OHKA KOGYO Co., Ltd.) was applied to the exposed surface of the dicing tape to prepare the protective film. Comparison was made on the degree of contamination of the dicing tape by changing an amount of application of TPF.

Next, the prepared TPF was applied onto the exposed surface of the dicing tape under the following conditions (i) to (iv): (i) film thickness was set to 0.4 µm, (ii) film thickness was set to 1.4 µm, (iii) film thickness was set to 2.6 µm, and (iv) film thickness was set to 0.7 µm. Under the condition (iv), the protective film was formed, and the stripping solution was applied onto the release layer while supplying 250 cc of pure water to the protective film. On the exposed surface, the protective film was formed in the largest thickness under the condition (iii), and the protective film was formed in the smallest thickness under the condition (i).

Next, as the stripping solution, 10 cc of mixed solvent of MMA:PGME=3:7 (weight ratio) was applied onto bodies to be processed in which the protective film was formed under the conditions (i) to (iv) to remove the release layer. Next, pure water was supplied to the protective film to dissolve the protective film. After removing the release layer, the degree of contamination of the exposed surface of the dicing tape due to attached materials was confirmed with a naked eye and a microscope, respectively. Results thereof are shown in FIG. 4.

FIG. 4 is a diagram illustrating the difference in the degree of contamination of the exposed surface when changing an amount of a material that forms the protective film applied onto the exposed surface of the dicing tape. In FIG. 4, general view photographs and microscope photographs of the exposed surface after removing the release layer are shown. In addition, processing results under conditions (i) to (iv) are shown in this order from a left-sided photograph.

The degree of contamination of the exposed surface of the dicing tape was determined on the basis of the general view photographs and the microscope photographs. The determination on the degree of contamination was performed in the same manner as Example 2.

From both of the general view photographs and the microscope photographs, it was observed that when the protective film was formed on the exposed surface of the dicing tape by using TPF, the contamination of the exposed surface could be prevented. In addition, when the protective film was formed in a larger thickness, the exposed surface could be protected to a degree in which there is little contamination of the exposed surface observed even in the microscope photographs.

Examples 4 to 12

In Examples 4 to 12, the material that constituted the release layer was removed by using mixed solvents having compositions shown in the following Table 1 as the stripping solution. In addition, preparation of the laminate and separation of the supporting member were performed under the same conditions as Examples 1 to 3. In Examples 4 to 12, 2-(methylamino)ethanol (MMA), monoethanolamine (MEA), 2-(2-aminoethoxy)ethanol (DGA), propylene glycol monomethyl ether (PGME), N-methyl-2-pyrrolidone (NMP), N-ethyl-2-pyrrolidone (NEP), and dimethyl sulfoxide (DMSO) were used to prepare the mixed solution.

TABLE 1

| | |
|---|---|
| Example 4 | MMA:PGME = 2:8 (weight ratio) |
| Example 5 | MMA:DGA = 8:2 (weight ratio) |
| Example 6 | MEA:PGME = 3:7 (weight ratio) |
| Example 7 | MEA:NMP = 3:7 (weight ratio) |
| Example 8 | MMA:NMP = 5:95 (weight ratio) |
| Example 9 | MMA:NMP = 3:7 (weight ratio) |
| Example 10 | MMA:NEP = 3:7 (weight ratio) |
| Example 11 | MMA:DMSO = 3:7 (weight ratio) |
| Example 12 | MEA:DMSO = 3:7 (weight ratio) |

As a result thereof, a total time taken to dissolve and remove the release layer and the adhesive layer was 365 seconds, and contamination of the wafer substrate could be prevented. In addition, contamination was not seen on the exposed surface of the dicing tape.

INDUSTRIAL APPLICABILITY

The invention can be appropriately used, for example, in a process of manufacturing a semiconductor wafer.

REFERENCE SIGNS LIST

1: Wafer
2: Dicing tape
3: Dicing frame (frame portion)
4: Nozzle
7: Nozzle
10: Adhesive layer
11: Release layer

The invention claimed is:

1. A processing method of processing a laminate in which a substrate, an adhesive layer, a release layer that is modified when absorbing light, and a supporting member are laminated in this order, the processing method comprising:
 a release layer removing process of modifying the release layer by irradiating the release layer with light, removing the supporting member from the laminate, and applying a stripping solution for removal of the release layer onto a structure body in which the release layer, the adhesive layer, and the substrate are laminated in this order to remove the release layer; and
 an adhesive layer dissolving process of applying a dissolving solution for dissolution of the adhesive layer onto the adhesive layer to dissolve the adhesive layer.

2. The processing method according to claim 1, further comprising:
- a washing process of applying a washing solution, which removes the stripping solution that remains on the adhesive layer after the release layer removing process, between the release layer removing process and the adhesive layer dissolving process.

3. The processing method according to claim 2, further comprising:
- a drying process of drying the adhesive layer between the washing process and the adhesive layer dissolving process.

4. The processing method according to claim 3,
- wherein in the substrate, a dicing tape is bonded to a surface that is opposite to a surface on which the adhesive layer is formed, and
- the processing method further comprises a protective film forming process of forming a protective film on an exposed surface, to which the substrate is not bonded, on a surface of a side of the dicing tape to which the substrate is bonded, before the release layer removing process.

5. The processing method according to claim 2,
- wherein in the substrate, a dicing tape is bonded to a surface that is opposite to a surface on which the adhesive layer is formed, and
- the processing method further comprises a first protective film forming process of forming a protective film containing a material, which is insoluble in the stripping solution, on an exposed surface, to which the substrate is not bonded, on a surface of a side of the dicing tape to which the substrate is bonded before the release layer removing process; and
- a second protective film forming process of forming a protective film containing a material, which is insoluble in the dissolving solution, on the exposed surface between the washing process and the adhesive layer dissolving process.

6. The processing method according to claim 2,
- wherein in the substrate, a dicing tape is bonded to a surface that is opposite to a surface on which the adhesive layer is formed, and
- the processing method further comprises a protective film forming process of forming a protective film on an exposed surface, to which the substrate is not bonded, on a surface of a side of the dicing tape to which the substrate is bonded, before the release layer removing process.

7. The processing method according to claim 1, wherein the stripping solution is composed of a material that does not dissolve the adhesive layer.

8. The processing method according to claim 7, wherein the stripping solution is alkaline.

9. The processing method according to claim 8, wherein the stripping solution is an amine-based compound.

10. The processing method according to claim 9, wherein the amine-based compound is at least one kind of amine-based compound selected from the group consisting of aliphatic amine, alicyclic amine, aromatic amine, and heterocyclic amine.

11. The processing method according to claim 8,
- wherein in the substrate, a dicing tape is bonded to a surface that is opposite to a surface on which the adhesive layer is formed, and
- the processing method further comprises a protective film forming process of forming a protective film on an exposed surface, to which the substrate is not bonded, on a surface of a side of the dicing tape to which the substrate is bonded, before the release layer removing process.

12. The processing method according to claim 7,
- wherein in the substrate, a dicing tape is bonded to a surface that is opposite to a surface on which the adhesive layer is formed, and
- the processing method further comprises a protective film forming process of forming a protective film on an exposed surface, to which the substrate is not bonded, on a surface of a side of the dicing tape to which the substrate is bonded, before the release layer removing process.

13. The processing method according to claim 1,
- wherein in the substrate, a dicing tape is bonded to a surface that is opposite to a surface on which the adhesive layer is formed, and
- the processing method further comprises a protective film forming process of forming a protective film on an exposed surface, to which the substrate is not bonded, on a surface of a side of the dicing tape to which the substrate is bonded, before the release layer removing process.

14. The processing method according to claim 13, wherein the protective film is composed of a material that is insoluble or poorly soluble in the stripping solution.

15. The processing method according to claim 14, wherein the material is soluble in water.

16. The processing method according to claim 13, wherein a thickness of the protective film is 0.1 μm to 5 μm.

17. The processing method according to claim 13,
- wherein an outer periphery of the dicing tape is provided with a frame portion, and
- in the protective film forming process, the protective film is formed on the exposed surface and a boundary surface between the dicing tape and the frame portion.

18. The processing method according to claim 13, wherein in the release layer removing process, the stripping solution is applied onto the release layer while supplying a protective solution that prevents the stripping solution from being attached to the exposed surface.

* * * * *